United States Patent
Chiang et al.

(10) Patent No.: US 10,217,761 B1
(45) Date of Patent: Feb. 26, 2019

(54) SEMICONDUCTOR STRUCTURE AND MANUFACTURING METHOD THEREOF

(71) Applicant: MACRONIX International Co., Ltd., Hsinchu (TW)

(72) Inventors: Chun-Ling Chiang, Hsinchu (TW); Chun-Min Cheng, Hsinchu (TW); Ming-Tsung Wu, Hsinchu County (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 15/821,344

(22) Filed: Nov. 22, 2017

(51) Int. Cl.
*H01L 27/105* (2006.01)
*H01L 27/11597* (2017.01)
*H01L 27/11582* (2017.01)
*H01L 29/49* (2006.01)
*H01L 21/02* (2006.01)
(Continued)

(52) U.S. Cl.
CPC .. *H01L 27/11582* (2013.01); *H01L 21/02063* (2013.01); *H01L 21/02532* (2013.01); *H01L 21/02598* (2013.01); *H01L 21/02636* (2013.01); *H01L 21/31111* (2013.01); *H01L 29/4916* (2013.01); *H01L 29/513* (2013.01); *H01L 29/518* (2013.01); *H01L 21/02271* (2013.01); *H01L 27/105* (2013.01); *H01L 27/11597* (2013.01)

(58) Field of Classification Search
CPC ...... H01L 27/105–27/11597; H01L 21/02063; H01L 21/02532; H01L 21/02598; H01L 21/02636; H01L 21/31111; H01L 29/4916; H01L 29/513; H01L 29/518

USPC .......................................... 257/324
See application file for complete search history.

(56) References Cited

U.S. PATENT DOCUMENTS 8,183,667 B2   5/2012   Park
9,064,699 B2   6/2015   Wang et al.
9,379,243 B1   6/2016   Hashemi et al.
(Continued)

FOREIGN PATENT DOCUMENTS

TW   201732872   9/2017

OTHER PUBLICATIONS

"Office Action of Taiwan Counterpart Application," dated Jun. 29, 2018, pp. 1-7.

*Primary Examiner* — Didarul A Mazumder
*Assistant Examiner* — Patricia D Reddington
(74) *Attorney, Agent, or Firm* — J.C. Patents

(57) ABSTRACT

A semiconductor structure for three-dimensional memory device and a manufacturing method thereof are provided. The semiconductor structure is disposed on the substrate and has a plurality of openings penetrating through the semiconductor structure and extending into the substrate. The semiconductor structure includes a substrate, a stacked structure and an epitaxial layer. The stacked structure includes insulating layers and gate layers stacked alternatively. Each of the plurality of openings includes a first portion located above the surface of the substrate and a second portion located below the surface of the substrate. The aspect ratio of the second portion is more than 1. The epitaxial layer is disposed in each of the plurality of openings. The top surface of the epitaxial layer is between the top surface and the bottom surface of the i-th insulating layer as counted upward from the substrate, wherein $i \geq 2$.

20 Claims, 2 Drawing Sheets

(51) Int. Cl.
*H01L 21/311* (2006.01)
*H01L 29/51* (2006.01)

(56) References Cited

U.S. PATENT DOCUMENTS

| | | | |
|---|---|---|---|
| 9,548,319 B2 | | 1/2017 | Jagannathan et al. |
| 9,627,472 B2 | | 4/2017 | Saggio et al. |
| 2015/0115348 A1 | | 4/2015 | Nam et al. |
| 2015/0279851 A1 | * | 10/2015 | Fan .................. H01L 27/11524 257/316 |
| 2016/0336338 A1 | | 11/2016 | Song et al. |
| 2017/0077136 A1 | | 3/2017 | Kim et al. |
| 2017/0148809 A1 | * | 5/2017 | Nishikawa ............ H01L 23/528 |
| 2017/0207232 A1 | | 7/2017 | You et al. |
| 2018/0083028 A1 | * | 3/2018 | Fukumoto ......... H01L 27/11582 |

\* cited by examiner

SEMICONDUCTOR STRUCTURE AND MANUFACTURING METHOD THEREOF

BACKGROUND OF THE INVENTION

Field of Invention

The present invention is related to a semiconductor structure and a manufacturing method thereof, and more generally to a semiconductor structure for a three-dimensional memory device and a manufacturing method thereof.

Description of Related Art

Since a non-volatile memory device has the advantage that stored data does not disappear at power-off, it becomes a widely used memory device for a personal computer or other electronic equipment. Besides, to further enhance the degree of integration of a memory device, a three-dimensional non-volatile memory is developed. However, there are still some challenges associated with three-dimensional non-volatile memory.

In the process of forming a three-dimensional non-volatile memory with a vertical channel, a stacked structure having oxide layers and nitride layers stacked alternately is formed on a substrate prior to the formation of a channel layer. Thereafter, an anisotropic etching process is performed to form openings that penetrate through the stacked structure and extend into the substrate. Afterwards, an epitaxial layer is formed in each of the openings. A charge storage layer and a channel layer are then formed in each of the openings.

However, after performing the anisotropic etching process to form the openings, defects and etching by-products remain on the bottoms of the openings and native oxide layers are generated on the substrate exposed by the bottoms of the openings. Accordingly, when the epitaxial layer is formed with an epitaxial growth process, the epitaxial layer in each of the openings has a different thickness due to the presence of defects, residues and native oxide layers, and even cannot be formed in the opening. Thereby, the performance of the device is affected.

SUMMARY OF THE INVENTION

The present invention provides a semiconductor structure for a three-dimensional memory device and a manufacturing method thereof, in which the top surfaces of epitaxial layers formed in multiple openings are substantially coplanar, and therefore, the performance of the resulting device is improved.

The present invention provides a semiconductor structure for a three-dimensional memory device, and the semiconductor structure includes a substrate, a stacked structure and epitaxial layers. The stacked structure is disposed on the substrate and has a plurality of openings penetrating through the stacked structure and extending into the substrate. The stacked structure includes a plurality of insulating layers and a plurality of gate layers alternately stacked, each of the plurality of openings includes a first portion located above a surface of the substrate and a second portion located below the surface of the substrate, and an aspect ratio of the second portion is greater than 1. An epitaxial layer is disposed in each of the plurality of openings, wherein a top surface of the epitaxial layer is between a top surface of and a bottom surface of an i-th insulating layer as counted upward from the substrate, and i≥2.

According to an embodiment of the present invention, a depth of the second portion is greater than or equal to 900 Å.

According to an embodiment of the present invention, top surfaces of the epitaxial layers in the plurality of openings are substantially coplanar.

According to an embodiment of the present invention, a height difference between the top surfaces of the epitaxial layers in the plurality of openings is no more than 200 Å.

According to an embodiment of the present invention, a thickness of the i-th insulating layer is greater than thicknesses of the rest of the plurality of insulating layers.

According to an embodiment of the present invention, the substrate includes a single-crystalline silicon substrate.

According to an embodiment of the present invention, the insulating layers include oxide layers.

According to an embodiment of the present invention, the gate layers include polysilicon layers.

The present invention provides a manufacturing method of a semiconductor structure for a three-dimensional memory device that includes the following steps. A stacked structure is formed on a substrate, and the stacked structure includes a plurality of insulating layers and a plurality of sacrificial layers alternately stacked. A plurality of openings are formed to penetrate through the stacked structure and extend into the substrate, wherein each of the plurality of openings includes a first portion located above a surface of the substrate and a second portion located below the surface of the substrate, and an aspect ratio of the second portion is greater than 1. An epitaxial layer is formed in each of the plurality of openings, wherein a top surface of the epitaxial layer is between a top surface of and a bottom surface of an i-th insulating layer as counted upward from the substrate, and i≥2.

According to an embodiment of the present invention, a depth of the second portion is greater than or equal to 900 Å.

According to an embodiment of the present invention, top surfaces of the epitaxial layers in the plurality of openings are substantially coplanar.

According to an embodiment of the present invention, a height difference between the top surfaces of the epitaxial layers in the plurality of openings is no more than 200 Å.

According to an embodiment of the present invention, a thickness of the i-th insulating layer is greater than thicknesses of the rest of the plurality of insulating layers.

According to an embodiment of the present invention, the substrate includes a single-crystalline silicon substrate.

According to an embodiment of the present invention, the insulating layers include oxide layers.

According to an embodiment of the present invention, the sacrificial layers include nitride layers.

According to an embodiment of the present invention, a method of forming the plurality of openings includes performing an anisotropic etching process.

According to an embodiment of the present invention, a method of forming the epitaxial layer includes performing an epitaxial growth process.

According to an embodiment of the present invention, the method further includes performing a cleaning process to the plurality of openings after forming the plurality of openings and before forming the epitaxial layers.

According to an embodiment of the present invention, the cleaning process includes performing a hydrofluoric acid cleaning treatment to remove impurities in the plurality of openings, and performing a SiCoNi cleaning treatment to remove native oxide layers in the plurality of openings.

In view of the above, in the present invention, openings are formed to penetrate through a stacked structure and extend into a substrate, and the portion of each opening that extends into the substrate has an aspect ratio of greater than 1 (e.g., the depth of the opening is greater than or equal to 900 Å). By such manner, the portion of each opening that extends into the substrate has a larger sidewall area with less defects or even no defects, and therefore, the top surfaces of epitaxial layers formed in multiple openings are substantially coplanar.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
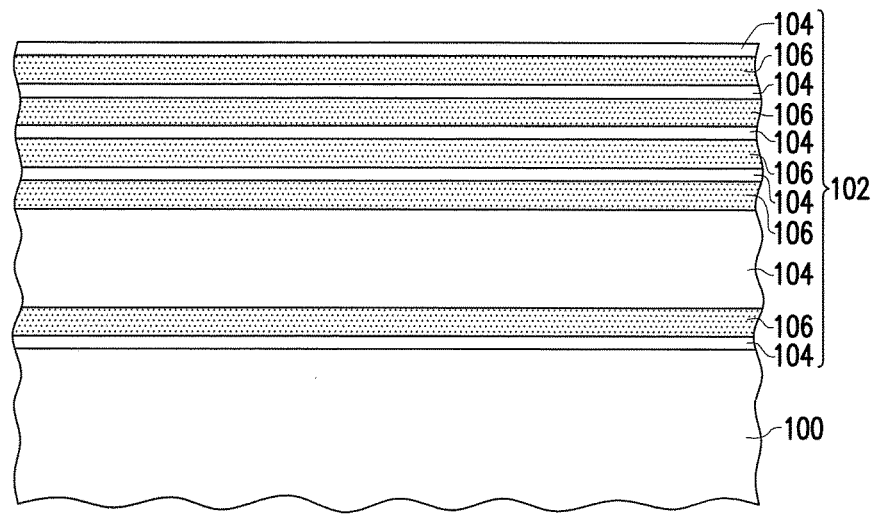
FIG. 1A to FIG. 1C are schematic cross-sectional views of a manufacturing method of a semiconductor structure according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

Figure 1B:
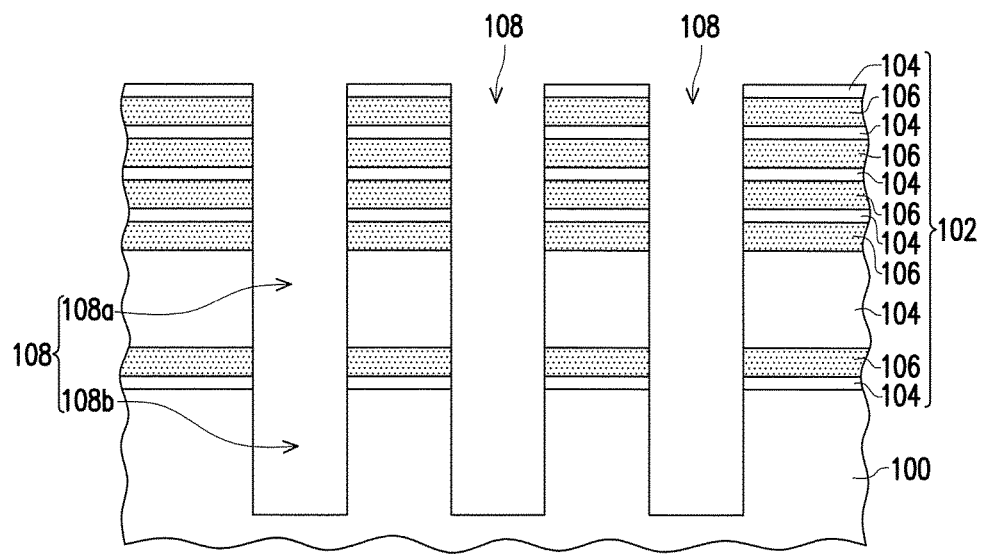
Figure 1C:
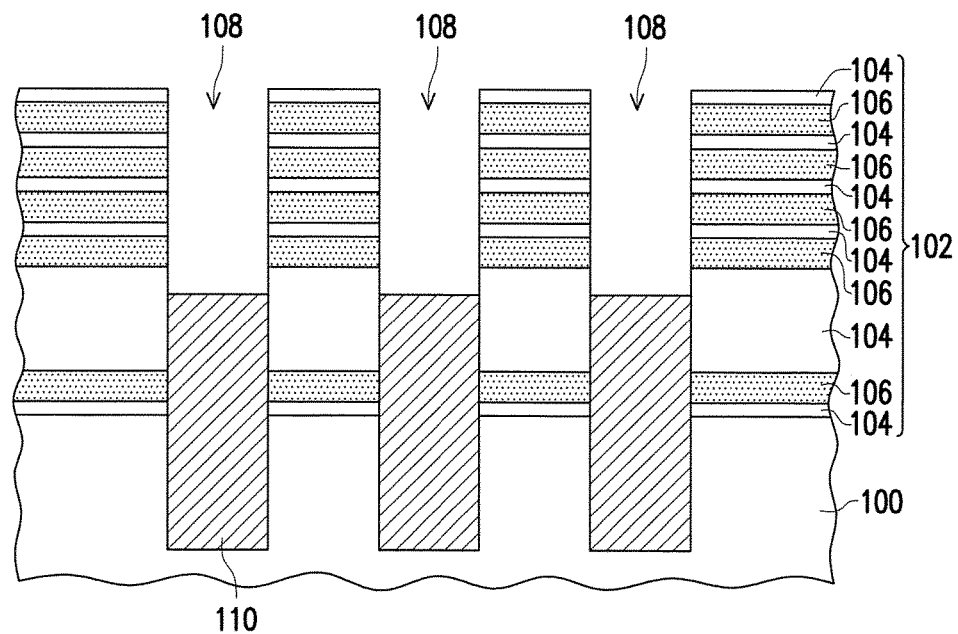

FIG. 1A to FIG. 1C are schematic cross-sectional views of a manufacturing method of a semiconductor structure according to an embodiment of the present invention. The semiconductor structure can be applied to a three-dimensional memory device. Therefore, the present invention will be appropriately described with respect to the manufacture of a three-dimensional memory device in the following.

Referring to FIG. 1A, a stacked structure 102 is formed on a substrate 100. For example, the substrate 100 can be a single-crystalline silicon substrate. Upon the design requirements, doped regions can be formed in the substrate 100. The stacked structure 102 includes a plurality of insulating layers 104 and a plurality of sacrificial layers 106 alternately stacked. In this embodiment, the insulating layers 104 can be oxide layers, and the sacrificial layers 106 can be nitride layers. The sacrificial layers 106 are subsequently replaced by control gates of a three-dimensional memory device, and the insulating layers 104 are configured to separate these control gates. The method of forming the insulating layers 104 and the sacrificial layers 106 includes performing multiple chemical vapour deposition (CVD) processes. The thicknesses of the insulating layers 104 and the sacrificial layers 106 can be respectively adjusted upon the actual requirements.

In this embodiment, the thickness of the $2^{nd}$ insulating later 104 as counted upward from the substrate 100 is greater than thicknesses of the rest of the insulating layers 104. However, the present invention is not limited thereto. In another embodiment, the thickness of the $3^{rd}$, $4^{th}$ or i-th (i>4) insulating layer 104 as counted upward from the substrate 100 can be designed to be greater than thicknesses of the rest of the insulating layers 104. This will be further described below. In FIG. 1A, the substrate 100 has six insulating layers 104 and five sacrificial layers 106 alternately stacked thereon. However, the present invention is not limited thereto. In another embodiment, the numbers of the insulating layers 104 and the sacrificial layers 106 can be adjusted upon the actual requirements.

Referring to FIG. 1B, openings 108 are formed to penetrate through the stacked structure 102 and extend into the substrate 100. Three openings 108 are formed in FIG. 1B. However, the present invention is not limited thereto. In another embodiment, the number of the openings 108 can be adjusted upon the actual requirements. In the process of manufacturing a three-dimensional memory device, vertical channels are formed in the openings 108. In an embodiment, the openings 108 can be referred to as vertical channel openings. The method of forming the openings 108 includes forming a mask layer on the stacked structure 102, and then performing an anisotropic etching process by using the mask layer as an etching mask. Due to the property of an anisotropic etching process itself, more defects are usually generated on the bottoms of the openings 108, while less defects or even no defects are generated on the sidewalls of the openings 108 during the step of forming the openings 108. Besides, etching by-products usually remain on the bottoms of the openings 108 after the step of forming the openings 108. In addition, native oxide layers are typically formed when the bottoms of the openings 108 are exposed to an external environment after the formation of the openings 108. The above-mentioned defects, etching by-products and native oxide layers affect the quality of the layers subsequently formed in the openings 108.

Each of the openings 108 has a first portion 108a located above the surface of the substrate 100 and a second portion 108b located below the surface of the substrate 100. That is, the first portion 108a of each of the openings 108 is located in the stacked structure 102, and the second portion 108b of each of the openings 108 is located in the substrate 100. In this embodiment, the depth of the first portion 108a of each of the openings 108 depends on the thickness of the stacked structure 102, without any particular limitation. However, the aspect ratio of the second portion 108b of each of the openings 108 is required to be greater than 1. In an embodiment, the depth of second portion 108b of each of the openings 108 can be greater than or equal to 900 Å. The depths of the second portions 108b of the openings 108 are substantially the same as one another. In the case that the second portion 108b of each of the openings 108 has an aspect ratio of greater than 1, even though the depths of the second portions 108b of the openings 108 are different, there is no significant effect on the invention. This will be further described below.

Referring to FIG. 1C, an epitaxial layer 110 is formed in each of the openings 108. In this embodiment, the epitaxial layer is formed as a single-crystalline silicon layer since the substrate 100 is a single-crystalline silicon substrate. The method of forming the epitaxial layers 110 includes performing an epitaxial growth process. In this embodiment, a cleaning process can be optionally performed to the openings 108 before the epitaxial layers 110 are formed in the openings 108, so as to remove the etching by-product and native oxide layers in the openings 108 as much as possible. The cleaning process includes performing a hydrofluoric acid cleaning treatment to remove impurities (e.g., etching by-products) in the openings 108, and then performing a SiCoNi cleaning treatment is performed to remove native oxide layers in the openings 108. However, the present invention is not limited thereto.

In this embodiment, the second portion 108b of each of the openings 108 has an aspect ratio of greater than 1 (e.g., the depth thereof is greater than or equal to 900 Å). By such disposition, the second portion 108b of each opening 108 has a larger sidewall area with less defects or even no defects. Specifically, due to the property of an epitaxial growth process itself, the epitaxial crystals extending from the sidewall toward the center can be combined at the top of the second portion 108b and then continue growing upwardly, and thus, in each opening 108, the epitaxial layer on the substrate 100 (i.e., the epitaxial layer in the first portion 108a) may have substantially the same growth rate and good quality. In addition, the thickness of the epitaxial layer 110 in each opening 108 may be uniform because the epitaxial layer on the substrate 100 has substantially the same growth rate. That is, the epitaxial layers in the openings 108 are formed with substantially the same thickness, and the top surfaces thereof are substantially coplanar. For example, the height difference between the top surfaces of the epitaxial layers 110 in the openings 108 is no more than 200 Å.

Figure 2:
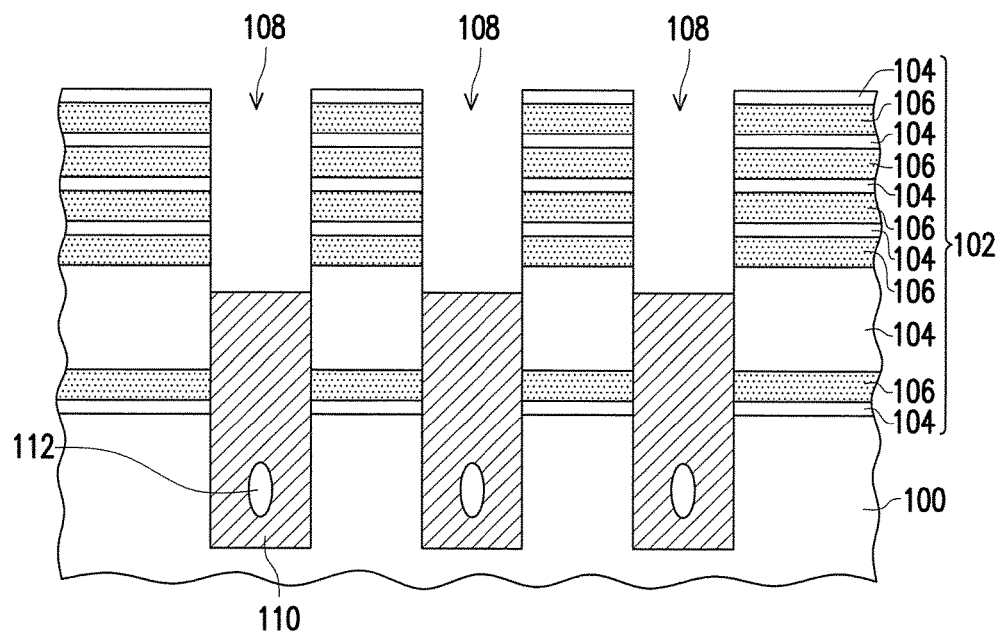
FIG. 2 is a schematic cross-sectional view of a semiconductor structure according to another embodiment of the present invention.

Besides, the second portion 108b of each of the openings 108 has an aspect ratio of greater than 1 (e.g., the depth thereof is greater than or equal to 900 Å). By such disposition, even though by-products, native oxide layers and/or defects remain on the bottoms of the openings 108 and therefore affect the epitaxial growth process, the performance of the resulting device is not affected. Specifically, as shown in FIG. 2, voids 112 are formed in lower portions of the epitaxial layers 110 because the epitaxial growth process is affected due to the presence of by-products, native oxide layers and/or defects. However, since each of the openings 108 has a larger sidewall area with less defects or even no defects, the portions of the resulting epitaxial layers 110 above the surface of the substrate 100 are still formed with good quality, and the top surfaces of the resulting epitaxial layers 110 are still substantially coplanar. Such epitaxial layers 110 of the invention are beneficial to the subsequent process steps, and thus, a three-dimensional memory device with good performance is accordingly formed.

Moreover, in this embodiment, the top surface of the epitaxial layer 110 is located between the top surface and the bottom surface of the $2^{nd}$ insulating layer 104 as counted upward from the substrate 100, and the thickness of the $2^{nd}$ insulating layer 104 is greater than thicknesses of the rest of the insulating layers 104. However, the present invention is not limited thereto. In another embodiment, the top surface of the epitaxial layer 110 can be located between the top surface and the bottom surface of the i-th (i>2) insulating layer 104 as counted upward from the substrate 100 as long as the thickness of this i-th (i>2) insulating layer 104 is greater than thicknesses of the rest of the insulating layers 104.

In the present invention, the thickness of the i-th (i≥2) insulating layer 104 is greater than thicknesses of the rest of the insulating layers 104, and such disposition provides a wider process window for an epitaxial growth process. Specifically, the top surfaces of the epitaxial layers 110 are likely formed between the top surface and the bottom surface of the i-th (i≥2) insulating layer with a thicker thickness, rather than between the top surface and the bottom surface of the adjacent sacrificial layer 106.

After forming the structure in FIG. 1C, subsequent processes can be performed to form a three-dimensional memory device. The subsequent processes include forming a charge storage structure (oxide layer/nitride layer/oxide layer) and a channel layer on the sidewall of each opening 108, and replacing the sacrificial layers 106 with gate layers (e.g., control gates), etc. These processes are known to people having ordinary skilled in the art, so the details are not iterated herein.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A semiconductor structure for a three-dimensional memory device, comprising:
    a substrate;
    a stacked structure, disposed on the substrate and having a plurality of openings penetrating through the stacked structure and extending into the substrate, wherein the stacked structure comprises a plurality of insulating layers and a plurality of gate layers alternately stacked, each of the plurality of openings comprises a first portion located above a surface of the substrate and a second portion located below the surface of the substrate, and an aspect ratio of the second portion is greater than 1; and
    an epitaxial layer, disposed in each of the plurality of openings, wherein a top surface of the epitaxial layer is between a top surface of and a bottom surface of an i-th insulating layer as counted upward from the substrate, and i≥2.

2. The semiconductor structure of claim 1, wherein a depth of the second portion is greater than or equal to 900 Å.

3. The semiconductor structure of claim 1, wherein top surfaces of the epitaxial layers in the plurality of openings are substantially coplanar.

4. The semiconductor structure of claim 3, wherein a height difference between the top surfaces of the epitaxial layers in the plurality of openings is no more than 200 Å.

5. The semiconductor structure of claim 1, wherein a thickness of the i-th insulating layer is greater than thicknesses of the rest of the plurality of insulating layers.

6. The semiconductor structure of claim 1, wherein the substrate comprises a single-crystalline silicon substrate.

7. The semiconductor structure of claim 1, wherein the insulating layers comprise oxide layers.

8. The semiconductor structure of claim 1, wherein the gate layers comprise polysilicon layers.

9. A manufacturing method of a semiconductor structure for a three-dimensional memory device, comprising:
    forming a stacked structure on a substrate, wherein the stacked structure comprises a plurality of insulating layers and a plurality of sacrificial layers alternately stacked;
    forming a plurality of openings that penetrate through the stacked structure and extend into the substrate, wherein each of the plurality of openings comprises a first portion located above a surface of the substrate and a second portion located below the surface of the substrate, and an aspect ratio of the second portion is greater than 1; and
    forming an epitaxial layer in each of the plurality of openings, wherein a top surface of the epitaxial layer is between a top surface of and a bottom surface of an i-th insulating layer as counted upward from the substrate, and i≥2.

10. The method of claim 9, wherein a depth of the second portion is greater than or equal to 900 Å.

11. The method of claim 9, wherein top surfaces of the epitaxial layers in the plurality of openings are substantially coplanar.

12. The method of claim 11, wherein a height difference between the top surfaces of the epitaxial layers in the plurality of openings is no more than 200 Å.

13. The method of claim 9, wherein a thickness of the i-th insulating layer is greater than thicknesses of the rest of the plurality of insulating layers.

14. The method of claim 9, wherein the substrate comprises a single-crystalline silicon substrate.

15. The method of claim 9, wherein the insulating layers comprise oxide layers.

16. The method of claim 9, wherein the sacrificial layers comprise nitride layers.

17. The method of claim 9, wherein a method of forming the plurality of openings comprises performing an anisotropic etching process.

18. The method of claim 9, wherein a method of forming the epitaxial layer comprises performing an epitaxial growth process.

19. The method of claim 9, further comprising, after forming the plurality of openings and before forming the epitaxial layers, performing a cleaning process to the plurality of openings.

20. The method of claim 19, wherein the cleaning process comprises:
performing a hydrofluoric acid cleaning treatment to remove impurities in the plurality of openings; and
performing a SiCoNi cleaning treatment to remove native oxide layers in the plurality of openings.

* * * * *